(12) United States Patent
Yang et al.

(10) Patent No.: US 9,406,527 B2
(45) Date of Patent: Aug. 2, 2016

(54) SEMICONDUCTOR DEVICE MANUFACTURING METHOD AND RELATED SEMICONDUCTOR WAFER

(71) Applicant: Semiconductor Manufacturing International (Shanghai) Corporation, Shanghai (CN)

(72) Inventors: Jun Yang, Shanghai (CN); Li Jiang, Shanghai (CN); Mingqi Li, Shanghai (CN); Pulei Zhu, Shanghai (CN); Xiantao Li, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/810,111

(22) Filed: Jul. 27, 2015

(65) Prior Publication Data

US 2016/0042973 A1    Feb. 11, 2016

(30) Foreign Application Priority Data

Aug. 7, 2014    (CN) .......................... 2014 1 0386885

(51) Int. Cl.
*H01L 21/321*    (2006.01)
*H01L 27/088*    (2006.01)
*H01L 21/02*    (2006.01)
*H01L 21/306*    (2006.01)

(52) U.S. Cl.
CPC ...... *H01L 21/3212* (2013.01); *H01L 21/02068* (2013.01); *H01L 21/30625* (2013.01); *H01L 27/088* (2013.01)

(58) Field of Classification Search
CPC .................. H01L 21/823456; H01L 21/0217; H01L 21/28035; H01L 21/31055; H01L 21/31111; H01L 22/26; H01L 27/088
USPC ........................................................ 257/392
See application file for complete search history.

(56) References Cited

U.S. PATENT DOCUMENTS

| | | | |
|---|---|---|---|
| 2001/0031558 A1 | 10/2001 | Sun et al. | |
| 2003/0104762 A1* | 6/2003 | Sato ...................... | B24B 37/013 451/9 |
| 2005/0112894 A1* | 5/2005 | Park .......................... | C09G 1/02 438/693 |
| 2006/0242912 A1* | 11/2006 | Roh .................. | H01L 21/30625 51/308 |
| 2012/0264302 A1* | 10/2012 | Hsu ................... | H01L 21/02065 438/693 |

* cited by examiner

*Primary Examiner* — Karen Kusumakar
*Assistant Examiner* — Adam S Bowen
(74) *Attorney, Agent, or Firm* — Innovation Counsel LLP

(57) ABSTRACT

A method for processing a wafer (in a process of manufacturing semiconductor devices) may include the following steps: using a first slurry set to perform a first chemical mechanical polishing process on the wafer, wherein the wafer includes a plurality of metal gate structures; using a second slurry set to perform a second chemical mechanical polishing process on the wafer, wherein a concentration of a slurry material in the second slurry set is less than a concentration of the slurry material in the first slurry set; performing a cleaning process on the wafer; and providing an anti-reflective coating on the wafer.

17 Claims, 4 Drawing Sheets

SEMICONDUCTOR DEVICE MANUFACTURING METHOD AND RELATED SEMICONDUCTOR WAFER

CROSS-REFERENCE TO RELATED APPLICATION

This application claims priority to and benefit of Chinese Patent Application No. 201410386885.3, filed on Aug. 7, 2014; the Chinese Patent Application is incorporated herein by reference in its entirety.

BACKGROUND OF THE INVENTION

The present invention is related to a method for manufacturing semiconductor devices and a semiconductor wafer formed in a process of manufacturing the semiconductor devices.

FIG. 1 shows schematic diagram (e.g., a schematic top view) that illustrates a semiconductor wafer 100 formed in a process of manufacturing semiconductor devices. FIG. 2 shows a schematic diagram (e.g., an enlarged image) that illustrates a bump defect 101 on the wafer 100.

In a process of manufacturing semiconductor devices, a chemical mechanical polishing (CMP) process may be performed on the wafer 100 after metal gate structures have been formed on the wafer 100. For facilitating lithography, an anti-reflective coating may be formed on the wafer 100 after the CMP process.

During the CMP process, metal ions may be generated on the polished surface of the wafer 100. The metal ions may lead to a substantially large amount of bump defects, including a bump defect 101, on the wafer 100 after the anti-reflective coating has been formed on the wafer 100. Typically, the amount of the bump defects on the wafer 100 may be at least 200. The bump defects may result in substantially defective semiconductor devices produced from the wafer 100. Given the substantially large amount of the bump defects on the wafer 100, the manufacturing yield associated with the manufacturing process may be unsatisfactory.

SUMMARY

An embodiment of the present invention may be related to a method for processing a wafer in a process of manufacturing semiconductor devices. The method may include the following steps: using a first slurry set to perform a first chemical mechanical polishing process on the wafer, wherein the wafer may include a plurality of metal gate structures; using a second slurry set to perform a second chemical mechanical polishing process on the wafer, wherein a concentration of a slurry material in the second slurry set may be less than a concentration of the slurry material in the first slurry set; performing a cleaning process on the wafer; and providing an anti-reflective coating on the wafer.

The method may include the following step: after the second chemical mechanical polishing process and before the cleaning process, applying hydrogen peroxide ($H_2O_2$) to the wafer for performing a buffing process on the wafer. The hydrogen peroxide may be applied to the wafer for a time length in a range of 10 seconds to 30 seconds.

The second chemical mechanical polishing process may include the following step: providing a set of the slurry material onto a polishing pad at a flow rate in a range of 25 milliliters per minute to 200 milliliters per minute, wherein a set of hydrogen peroxide may be provided for diluting the set of the slurry material to produce the second slurry set. The wafer may be polished by the polishing pad.

The second chemical mechanical polishing process may include the following step: providing a set of hydrogen peroxide onto a polishing pad when a set of the slurry material is being provided onto the polishing pad. The set of hydrogen peroxide may be provided onto the polishing pad at a flow rate in a range of 200 milliliters per minute to 500 milliliters per minute. The set of the slurry material and the set of hydrogen peroxide, in combination, may form the second slurry set. The wafer may be polished by the polishing pad.

The method may include the following step: before performing the second chemical mechanical polishing process, diluting a set of the slurry material with a set of hydrogen peroxide to produce the second slurry set. In the second slurry set, a ratio of a volume faction of the set of the slurry material to a volume fraction of the set of hydrogen peroxide may be in a range of 1:20 to 1:1. The second chemical mechanical polishing process may include the following step: providing the second slurry set onto a polishing pad at a flow rate in a range of 225 milliliters per minute to 700 milliliters per minute.

The second mechanical polishing process may include the following step: rotating a polishing pad (and/or a platen that carries the polishing pad) at a speed in a range of 30 revolutions per minute to 110 revolutions per minute when the second slurry set is provided onto a polishing pad; and applying a pressure (to a carrier that carries the wafer) to push the wafer against the polishing pad. The pressure may be in a range of 0.8 pound per square inch to 2.5 pounds per square inch.

The cleaning process may include the following steps: using a first brush and a first cleaning agent set to clean a surface of the wafer; and (subsequently or simultaneously) applying a first hydrogen peroxide set to the surface of the wafer. The first cleaning agent set may include a first set of organic acids and/or a first non-fluorinated cleaning solution set. The first cleaning agent set may be applied to the wafer for a time length in a range of 10 seconds to 60 seconds. The first hydrogen peroxide set may be applied to the wafer for a time length in a range of 30 seconds to 100 seconds.

The cleaning process may further include the following steps: after the first hydrogen peroxide set has been applied to the wafer, using a second brush and a second cleaning agent set to clean the surface of the wafer; and (subsequently or simultaneously) applying a second hydrogen peroxide set to the surface of the wafer. The second cleaning agent set may include a second set of organic acids and/or a second non-fluorinated cleaning solution set. The second cleaning agent set may be applied to the wafer for a time length in a range of 10 seconds to 60 seconds. The second hydrogen peroxide set may be applied to the wafer for a time length in a range of 30 seconds to 100 seconds.

An embodiment of the present invention may be related to a wafer formed in a process of manufacturing semiconductor devices. The wafer may include a plurality of metal gate structures. The wafer may further include an anti-reflective that overlaps (and/or covers) all metal gate structures that are included in the wafer. A total number of bump defects on the anti-reflective coating may be less than or equal to 100. In an embodiment, the total number of the bump defects on the anti-reflective coating may be less than or equal to 50.

According to embodiments of the invention, the amount of bump defects on a wafer formed in a process of manufacturing semiconductor devices may be substantially low. Advantageously, satisfactory quality of the semiconductor devices and a satisfactory yield of the manufacturing process may be substantially attained.

The above summary is related to some of many embodiments of the invention disclosed herein and is not intended to limit the scope of the invention.

DETAILED DESCRIPTION

Figure 1:
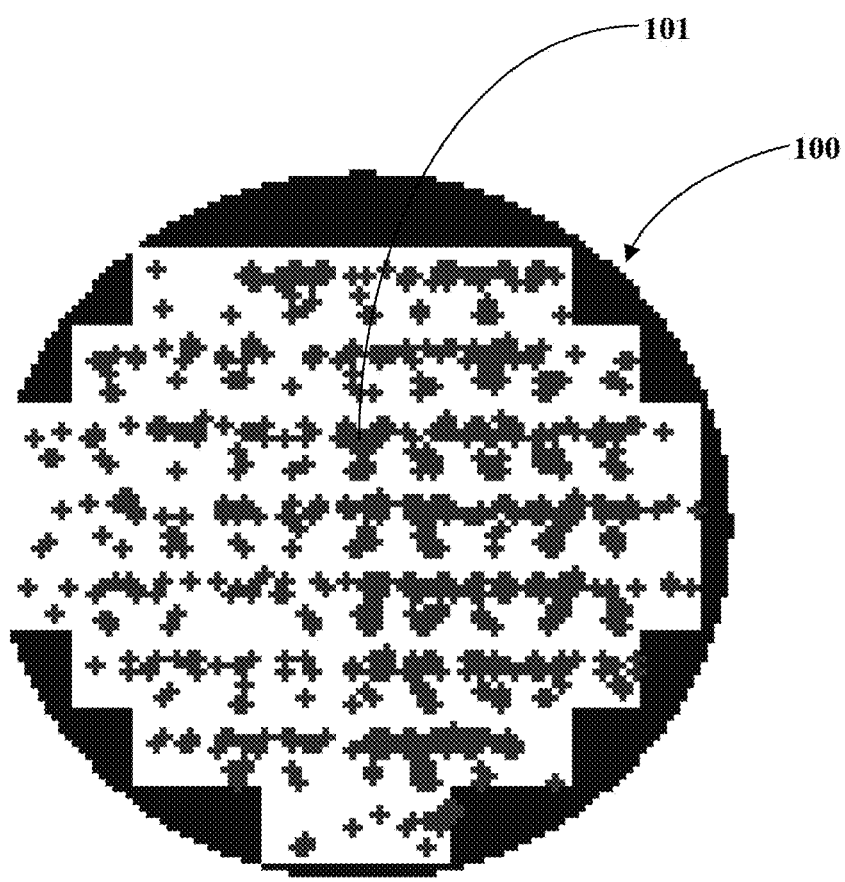
FIG. 1 shows a schematic diagram (e.g., a schematic top view) that illustrates a semiconductor wafer formed in a process of manufacturing semiconductor devices.
Figure 2:
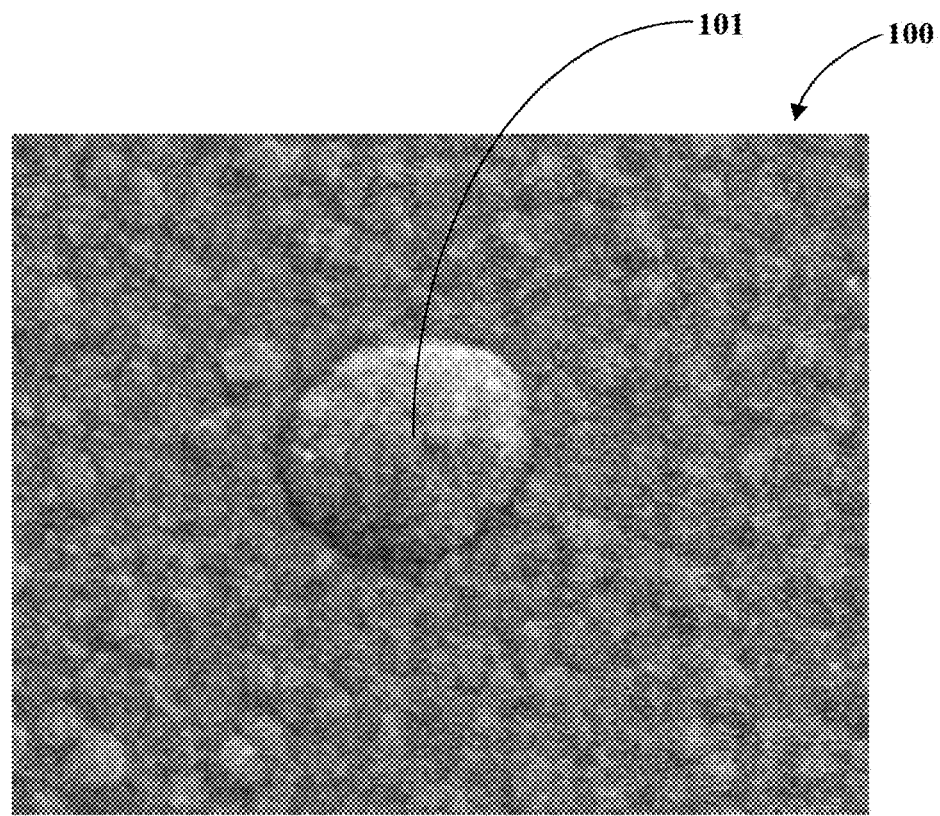
FIG. 2 shows a schematic diagram (e.g., an enlarged image) that illustrates a bump defect on a semiconductor wafer formed in a process of manufacturing semiconductor devices.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements.

For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 3:
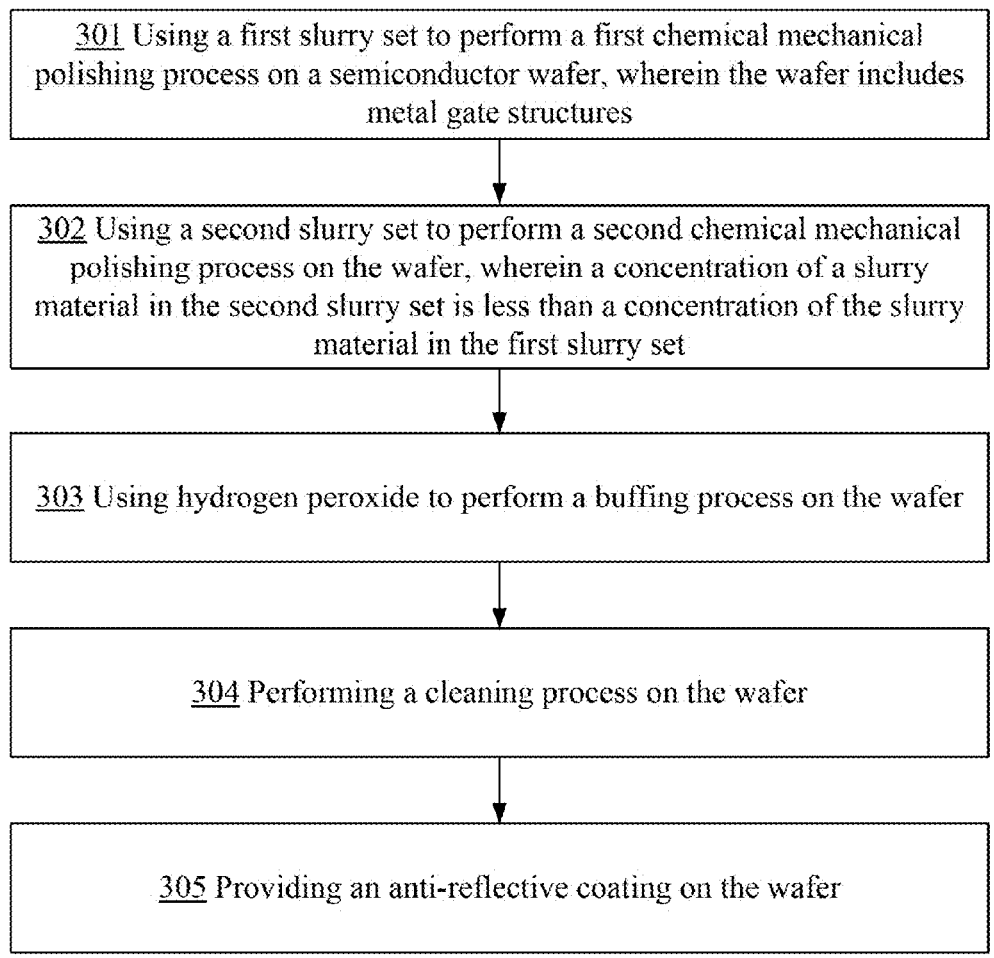
FIG. 3 shows a flowchart that illustrates steps in a method for processing a semiconductor wafer in a process of manufacturing of semiconductor devices in accordance with one or more embodiments of the present invention.

FIG. 3 shows a flowchart that illustrates steps in a method for processing a semiconductor wafer in a process of manufacturing semiconductor devices in accordance with one or more embodiments of the present invention. The method may include steps 301, 302, 303, 304, and 305.

The step 301 may include using a first slurry set to perform a first chemical mechanical polishing process on the wafer. The wafer may include a plurality of metal gate structures. The metal gate structures may include metal gates that are formed of a metal material, such as aluminum. The first mechanical polishing process may include the following step: rotating a polishing pad (and/or a platen that carries the polishing pad) when the first slurry set is provided onto a polishing pad; and applying a pressure (to a carrier that carries the wafer) to push the wafer against the polishing pad. The polishing pad may be rotated at a speed in a range of 30 revolutions per minute to 110 revolutions per minute. The pressure may be in a range of 0.8 pound per square inch to 2.5 pounds per square inch.

Subsequent to the step 301, the step 302 may include using a second slurry set to perform a second chemical mechanical polishing process on the wafer. The second chemical mechanical polishing process may be performed on one or more of metal gate structures, positive metal-oxide-semiconductor field-effect transistor (PMOS) structures, negative metal-oxide-semiconductor field-effect transistor (NMOS) structures, related interfaces, etc. that are included on the wafer.

A concentration of a slurry material in the second slurry set may be less than a concentration of the slurry material in the first slurry set. The slurry material may include one or more of a corrosive medium, a film former, an additive, and a set of abrasive particles. Because of the relatively low concentration of the slurry material, the second chemical mechanical polishing process may produce a limited amount of byproducts (e.g., metal ions). As a result, the amount of bumps or unevenness on the processed surface of the wafer may be limited. Advantageously, the amount of defective semiconductor devices produced from the wafer may be substantially low.

In an embodiment, the second chemical mechanical polishing process may include providing a set of the slurry material onto a polishing pad at a flow rate in a range of 25 milliliters per minute to 200 milliliters per minute. The second chemical mechanical polishing process may include providing a set of hydrogen peroxide ($H_2O_2$) onto the polishing pad when the set of the slurry material is being provided onto the polishing pad. The set of hydrogen peroxide may be provided onto the polishing pad at a flow rate in a range of 200 milliliters per minute to 500 milliliters per minute. The set of the slurry material and the set of hydrogen peroxide, in combination, may form the second slurry set. The wafer may be polished by the polishing pad.

In an embodiment, the method may include the following step: before performing the second chemical mechanical polishing process, diluting a set of the slurry material with a set of hydrogen peroxide to produce the second slurry set. In the second slurry set, a ratio of a volume faction of the set of the slurry material to a volume fraction of the set of hydrogen peroxide may be in a range of 1:20 to 1:1. The second chemical mechanical polishing process may include providing the second slurry set onto a polishing pad at a flow rate in a range of 225 milliliters per minute to 700 milliliters per minute.

The second mechanical polishing process may include the following step: rotating a polishing pad (and/or a platen that carries the polishing pad) when the second slurry set is provided onto a polishing pad; and applying a pressure (to a carrier that carries the wafer) to push the wafer against the polishing pad. The polishing pad may be rotated at a speed in a range of 30 revolutions per minute to 110 revolutions per minute. The pressure may be in a range of 0.8 pound per square inch to 2.5 pounds per square inch.

Subsequent to the step 302, the step 303 may include applying hydrogen peroxide to the wafer to perform a buffing process on the wafer. The hydrogen peroxide may be applied to the wafer for a time length in a range of 10 seconds to 30 seconds. The buffing process may remove some of the byproducts (e.g., metal ions) and/or may enhance the efficiency of one or more subsequent cleaning processes.

Subsequent to the step 303, the step 304 may include performing a cleaning process on the wafer. The cleaning process may be performed using one or more of an organic acid, deionized water, a non-fluorinated cleaning solution, and CoppeReady™ CP72B, which may be commercially available from Air Products and Chemicals Inc. of Allentown, Pa., USA.

The cleaning process may include the following steps: using a first brush and a first cleaning agent set to clean a surface of the wafer; and (subsequently or simultaneously) applying a first hydrogen peroxide set to the surface of the wafer (for protecting metal gate structures). The first cleaning agent set may include one or more of a first set of organic acids, a first set of deionized water, a first non-fluorinated cleaning solution set, and a first set of CoppeReady™ CP72B. The first cleaning agent set may be applied to the wafer for a time length in a range of 10 seconds to 60 seconds. The first hydrogen peroxide set may be applied to the wafer for a time length in a range of 30 seconds to 100 seconds.

The cleaning process may further include the following step: after the first hydrogen peroxide set has been applied to the wafer, using a second brush and a second cleaning agent set to clean the surface of the wafer; and (subsequently or simultaneously) applying a second hydrogen peroxide set to the surface of the wafer (for protecting metal gate structures). The second cleaning agent set may include one or more of a second set of organic acids, a second set of deionized water, a second non-fluorinated cleaning solution set, and a second set of CoppeReady™ CP72B. The second cleaning agent set may be applied to the wafer for a time length in a range of 10 seconds to 60 seconds. The second hydrogen peroxide set may be applied to the wafer for a time length in a range of 30 seconds to 100 seconds.

The cleaning process may further remove residual byproducts (e.g., metal ions) from the process surface of the wafer. Advantageously, the amount of defects on the surface of the wafer may be substantially low.

Subsequent to the step 304, the step 305 may include providing (e.g., through a deposition process) an anti-reflective coating on the wafer. The anti-reflective coating may be formed of a dielectric material. In an embodiment, one or more other layers, e.g., an interlayer dielectric layer and/or an amorphous carbon layer, may be provided on the wafer between the steps 304 and 305. An example of a wafer resulted from the step 305 is illustrated in FIG. 4.

Figure 4:
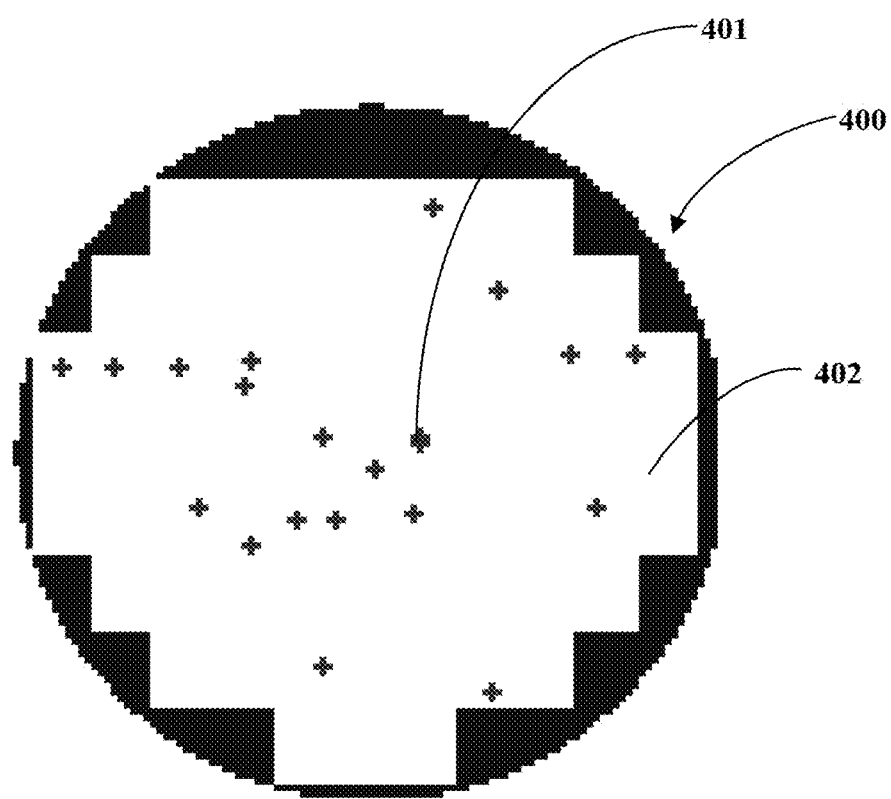
FIG. 4 shows schematic diagram (e.g., a schematic top view) that illustrates a semiconductor wafer formed in a process of manufacturing semiconductor devices in accordance with one or more embodiments of the present invention.

FIG. 4 shows schematic diagram (e.g., a schematic top view) that illustrates a semiconductor wafer 400 formed in a process of manufacturing semiconductor devices in accordance with one or more embodiments of the present invention. The wafer 400 may include a plurality of metal gate structures (which may be metal gate structures know in the art and is not shown in FIG. 4). The wafer may further include an anti-reflective coating 402 that overlaps, covers, and/or is positioned the plurality of metal gate structures. The anti-reflective coating 402 may overlap all gate structures that are included in the wafer. An area of the anti-reflective coating 402 may by substantially equal to an area of a top surface or a bottom surface of the wafer 400. The anti-reflective coating may be formed of a dielectric material. A total number of bump defects (including a bump defect 401) on the anti-reflective coating 402 may be less than or equal to 100. In an embodiment, the total number of the bump defects on the anti-reflective coating 402 may be less than or equal to 50.

An embodiment of the invention may be related to a semiconductor device produced from a wafer that has one or more of the above-discussed features and advantages.

An embodiment of the invention may be related to an electronic device that includes an electronic component and a semiconductor device that is electrically connected to the electronic component. The semiconductor device may be produced from a wafer that has one or more of the above-discussed features and advantages. In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

According to embodiments of the invention, the amount of bump defects on a wafer formed in a process of manufacturing semiconductor devices may be substantially low. Advantageously, satisfactory quality of the semiconductor devices and a satisfactory yield of the manufacturing process may be substantially attained.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for processing a wafer in a process of manufacturing semiconductor devices, the method comprising:
   using a first slurry set to perform a first chemical mechanical polishing process on the wafer, wherein the wafer includes a plurality of metal gate structures;
   using a second slurry set to perform a second chemical mechanical polishing process on the wafer, wherein a concentration of a slurry material in the second slurry set is less than a concentration of the slurry material in the first slurry set;
   providing a set of hydrogen peroxide onto the polishing pad when the second slurry set is being provided onto the polishing pad, wherein the hydrogen peroxide is provided at a flow rate greater than the flow rate at which the second slurry is provided;
   performing a cleaning process on the wafer; and
   providing an anti-reflective coating on the wafer.

2. The method of claim 1, wherein the second chemical mechanical polishing process comprises:
   providing a set of the slurry material onto a polishing pad at a flow rate in a range of 25 milliliters per minute to 200 milliliters per minute.

3. The method of claim 2, wherein the set of hydrogen peroxide is provided onto the polishing pad at a flow rate in a range of 200 milliliters per minute to 500 milliliters per minute.

4. The method of claim 1, wherein the second chemical mechanical polishing process comprises:
   providing a set of hydrogen peroxide onto a polishing pad when a set of the slurry material is being provided onto the polishing pad.

5. The method of claim 4, wherein the set of hydrogen peroxide is provided onto the polishing pad at a flow rate in a range of 200 milliliters per minute to 500milliliters per minute.

6. The method of claim 1, comprising: before performing the second chemical mechanical polishing process, diluting a set of the slurry material with a set of hydrogen peroxide to produce the second slurry set.

7. The method of claim 6, wherein the second chemical mechanical polishing process comprises:
   providing the second slurry set onto a polishing pad at a flow rate in a range of 225milliliters per minute to 700 milliliters per minute.

8. The method of claim 6, wherein in the second slurry set a ratio of a volume faction of the set of the slurry material to a volume fraction of the set of hydrogen peroxide is in a range of 1:20 to 1:1.

9. The method of claim 1, wherein the second chemical mechanical polishing process comprises: providing the second slurry set onto a polishing pad at a flow rate in a range of 225 milliliters per minute to 700 milliliters per minute.

10. The method of claim 1, wherein the second mechanical polishing process comprises:
    rotating a polishing pad at a speed in a range of 30 revolutions per minute to 110revolutions per minute when the second slurry set is provided onto a polishing pad; and
    applying a pressure to push the wafer against the polishing pad.

11. The method of claim 10, wherein the pressure is in a range of 0.8pound per square inch to 2.5 pounds per square inch.

12. The method of claim 1, wherein the cleaning process comprises:
    using a first brush and a first cleaning agent set to clean a surface of the wafer; and
    applying a first hydrogen peroxide set to the surface of the wafer.

13. The method of claim 12, wherein the first cleaning agent set includes a first set of organic acids, and wherein the first cleaning agent set is applied to the wafer for a time length in a range of 10 seconds to 60 seconds.

14. The method of claim 12, wherein the first hydrogen peroxide set is applied to the wafer for a time length in a range of 30 seconds to 100 seconds.

15. The method of claim 12, wherein the cleaning process further comprises:

after the first hydrogen peroxide set has been applied to the wafer, using a second brush and a second cleaning agent set to clean the surface of the wafer; and applying a second hydrogen peroxide set to the surface of the wafer.

16. The method of claim 1, further comprising: after the second chemical mechanical polishing process and before the cleaning process, using hydrogen peroxide to perform a buffing process on the wafer.

17. The method of claim 16, wherein the hydrogen peroxide is applied to the wafer for a time length in a range of 10 seconds to 30 seconds.

* * * * *